(12) United States Patent
Campanella-Pineda et al.

(10) Patent No.: US 10,476,480 B1
(45) Date of Patent: Nov. 12, 2019

(54) DUAL-MODE MEMS RESONATOR, OSCILLATOR, SENSOR, TIMING DEVICE, ACOUSTIC FILTER AND FRONT-END MODULE AND THE METHODS OF MAKING

(71) Applicant: GLOBALFOUNDRIES Singapore Pte. Ltd., Singapore (SG)

(72) Inventors: Humberto Campanella-Pineda, Singapore (SG); You Qian, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/029,223

(22) Filed: Jul. 6, 2018

(51) Int. Cl.
| H03H 9/64 | (2006.01) |
| H03H 9/46 | (2006.01) |
| H03H 9/54 | (2006.01) |
| H03H 9/72 | (2006.01) |
| H03B 5/30 | (2006.01) |

(Continued)

(52) U.S. Cl.
CPC .......... *H03H 9/64* (2013.01); *G01K 7/32* (2013.01); *H03B 5/30* (2013.01); *H03H 3/0072* (2013.01); *H03H 9/2405* (2013.01); *H03H 9/462* (2013.01); *H03H 9/54* (2013.01); *H03H 9/72* (2013.01); *H03B 2200/0014* (2013.01); *H03H 2009/02251* (2013.01);
(Continued)

(58) Field of Classification Search
CPC . H03B 5/30; H03B 5/32; H03B 5/326; H03B 2200/0014; H03H 2003/0071; H03H 3/0072; H03H 3/0076; H03H 2003/025; H03H 2003/027; H03H 2003/0414; H03H 3/08; H03H 3/10; H03H 9/02244; H03H 2009/02251; H03H 2009/02283; H03H 2009/02488; H03H 2009/02527; H03H 2009/02511; H03H 2009/02496; H03H 2009/2415; B81B 2203/01; B81B 2203/019; B81B 3/00; B81B 3/0097; B81C 1/00531; B81C 1/00555; B81C 2201/0132
See application file for complete search history.

(56) References Cited

U.S. PATENT DOCUMENTS

| 4,872,765 A | 10/1989 | Schodowski |
| 7,116,186 B2 | 10/2006 | Chen |

(Continued)

OTHER PUBLICATIONS

Li, Ming-Huang, et al. "Design and characterization of a dual-mode CMOS-MEMS resonator for TCF manipulation." Journal of Microelectromechanical Systems 24.2 (2014): 446-457. (Year: 2014).*

(Continued)

*Primary Examiner* — Ryan Johnson
(74) *Attorney, Agent, or Firm* — Ditthavong & Steiner P.C.

(57) ABSTRACT

A dual-mode resonator, devices employing the dual-mode resonator, and the methods of making the resonator and the devices are disclosed. Embodiments include a dual-mode resonator including a semiconductor substrate; a material on the semiconductor substrate, having a cavity formed therein; a seed layer over the cavity in a V-shape, wherein sides of the V-shape form an angle of 15 to 25 degrees with a horizontal line; a bottom electrode on the seed layer; an acoustic layer on the bottom electrode; a top electrode on the acoustic layer; and a mass loading layer on the top electrode; and a cap over the dual-mode resonator.

24 Claims, 8 Drawing Sheets

(51) Int. Cl.
- *G01K 7/32* (2006.01)
- *H03H 9/24* (2006.01)
- *H03H 3/007* (2006.01)
- *H03H 9/02* (2006.01)

(52) U.S. Cl.
CPC .......... *H03H 2009/02283* (2013.01); *H03H 2009/02488* (2013.01); *H03H 2009/02527* (2013.01)

(56) References Cited

U.S. PATENT DOCUMENTS

| | | | |
|---|---|---|---|
| 7,194,247 | B2 | 3/2007 | Tikka et al. |
| 7,424,772 | B2 | 9/2008 | Larson, III |
| 7,847,656 | B2 | 12/2010 | Ayazi et al. |
| 8,669,821 | B2 | 3/2014 | Hosoda |
| 8,686,614 | B2 | 4/2014 | Gaidarzhy et al. |
| 2007/0200650 | A1 | 8/2007 | Shih |
| 2010/0181868 | A1 | 7/2010 | Gaidarzhy et al. |
| 2011/0156823 | A1 | 6/2011 | Koyama et al. |
| 2013/0069742 | A1 | 3/2013 | Yasuda |
| 2016/0268998 | A1 | 9/2016 | Xu et al. |
| 2019/0173450 | A1* | 6/2019 | Jaakkola ............ H03H 9/02338 |

OTHER PUBLICATIONS

Fu, Jenna L., Roozbeh Tabrizian, and Farrokh Ayazi. "Dual-mode AlN-on-silicon micromechanical resonators for temperature sensing." IEEE Transactions on Electron Devices61.2 (2014): 591-597. (Year: 2014).*

Campanella, Humberto, et al. "Dual MEMS Resonator Structure for Temperature Sensor Applications." IEEE Transactions on Electron Devices 64.8 (2017): 3368-3376. (Year: 2017).*

Sun et al. "A Compact Dual-Passband Filter Based on Bulk Acoustic Wave Technology", published in Microwave Symposium (IMS), May 17-22, 2015, IEEE MTT-S International, retrieved on Oct. 13, 2017 from http://ieeexplore.ieee.org/document/7166848/, 4 pages.

Giner et al., "A fully integrated programmable dual-band RF filter based on electrically and mechanically coupled CMOS-MEMS resonators", published on Apr. 18, 2012, http://iopscience.iop.org/article/10.1088/0960-1317/22/5/055020/meta, 7 pages.

Meng et al., "NbN edge junction fabrication: Edge profile control by reactive ion etching", published in IEEE Transactions on magnetics, vol. 25, No. 2, Mar. 1989, retrieved on Nov. 8, 2017 from http://ieeexplore.ieee.org/document/92520/authors, pp. 1239-1242.

Lee et al., "Amorphous silicon thin film transistor fabricated with a new copper dry etching method", published in Electrochemical Society Proceedings vol. 2000-31, pp. 34-39, 2000.

Tabrizian et al., "Acoustically-Engineered Multi-Port AlN-on-Silicon Resonators for Accurate Temperature Sensing", published in IEEE 2013, Georgia Institute of Technology, Atlanta, GA, 4 pages.

Jha et al., "CMOS-Compatible Dual-Resonator MEMS Temperature Sensor with Milli-Degree Accuracy", Published in Solid-State Sensors, Actuators and Microsystems Conference, 2007, IEEE, retrieved on Nov. 2, 2017 from http://ieeexplore.ieee.org/document/4300111/, 4 pages.

Campanella et al., "Dual MEMS Resonator Structure for Temperature Sensor Applications", published in Transactions on Electron Devices,vol. 64, Issue: 8, Aug. 2017, IEEE, retrieved on Nov. 2, 2017 from http://ieeexplore.ieee.org/document/7940050/, pp. 3368-3376.

Fu et al., "Dual-Mode AlN-on-Silicon Micromechanical Resonators for Temperature Sensing", Published in Transactions on Electron Devices, vol. 61, Issue: 2, Feb. 2014, IEEE, retrieved on Nov. 2, 2017 from http://ieeexplore.ieee.org/document/6702452/, pp. 591-597.

* cited by examiner

DUAL-MODE MEMS RESONATOR, OSCILLATOR, SENSOR, TIMING DEVICE, ACOUSTIC FILTER AND FRONT-END MODULE AND THE METHODS OF MAKING

TECHNICAL FIELD

The present disclosure relates to fabrication of dual-mode microelectromechanical system (MEMS) resonators and devices including dual-mode MEMS resonators. The present disclosure is particularly applicable to dual-band acoustic filters, RF front-end modules, monolithic dual MEMS oscillators, thermometric beat frequency thermal sensor circuits, and high frequency clock sources.

BACKGROUND

The proliferation of long term evolution (LTE) bands has engendered a need for raising the number of single-band filter chips to about 30 in high-end phones. However, as the number of filters in the radio frequency (RF) module increases, the module footprint area also increases. Further, shrinking the size of the filter die is limited as the silicon (Si) area is fixed by impedance matching or, rather, the reduction in size is driven by packaging.

In addition, Si-made MEMS oscillators show decent performance, but they only operate at frequencies below 1 gigahertz (GHz). Aluminum nitride (AlN) resonator oscillators are suitable for high frequencies, but they suffer from thermal drifting that is too large for timing applications and too small for thermal sensing applications. Thermometric beat frequency sensors using a conventional MEMS might solve some problems, but 1) they have an uncertain thermal gradient between the resonators, which decreases sensitivity and accuracy, 2) they have an increased footprint, 3) they have process variations larger than the target accuracy (i.e. variations in resonator sizes), 4) the MEMS use overtone modes which have uneven energy and low electromechanical efficiency, and 5) they have restricted applications and accuracy due to frequency separation between the modes.

A need therefore exists for methodology enabling manufacture a dual-mode MEMS resonator and a dual band acoustic filter suitable for all LTE bands, having a reduced footprint area, and resulting devices. A need further exists for an MEMS oscillator which operates at high frequencies with thermal drifting small enough for timing applications yet large enough for thermal sensing applications, having a reduced footprint area, and resulting devices.

SUMMARY

An aspect of the present disclosure is a method of making a dual mode MEMS resonator structure having a V-shaped groove.

Further aspects of the present disclosure are a method of making a dual MEMS oscillator including a dual mode MEMS resonator structure having a V-shaped groove, a method of making a thermometric beat frequency thermal sensor circuit including the dual MEMS oscillator, and a method of making a high frequency clock source including the dual MEMS oscillator.

Other aspects of the present disclosure are a method of making a dual-band acoustic filter including an array of dual mode MEMS resonator structures having V-shaped grooves and a method of making an RF front-end module including the dual-band acoustic filter.

Another aspect of the present disclosure is a dual mode MEMS resonator structure having a V-shaped groove.

Further aspects of the present disclosure are a dual MEMS oscillator including a dual mode MEMS resonator structure having a V-shaped groove, a thermometric beat frequency thermal sensor circuit including the dual MEMS oscillator, and a high frequency clock source including the dual MEMS oscillator.

Other aspects of the present disclosure are a dual-band acoustic filter including an array of dual mode MEMS resonator structures having V-shaped grooves, and an RF front-end module including the dual-band acoustic filter.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a material on a semiconductor substrate; forming a V-shaped groove in the material, forming a grooved area, sides of the V-shaped groove forming an angle of 15 to 25 degrees with a horizontal line; forming a seed layer on the grooved area; forming a bottom electrode on the seed layer; forming an acoustic layer on the bottom electrode; forming a top electrode on the acoustic layer; forming a mass loading layer on the top electrode; forming release vias through the top electrode, the acoustic layer, the bottom electrode, and the seed layer; removing at least a portion of the material through the release vias, forming a dual-mode resonator; and forming a cap over the dual-mode resonator.

Aspects of the present disclosure include forming two transconductance transistor amplifiers on the substrate; and connecting the two amplifiers to the dual mode resonator, forming a monolithic dual MEMS oscillator. Further aspects include forming a first oscillator using a first mode of the dual mode resonator and a first of the two amplifiers; forming a second oscillator using a second mode of the resonator and a second of the two amplifiers; forming a frequency multiplier that up-converts an oscillation signal of the first or the second oscillator; forming a mixer that multiplies both oscillation signals; forming a low-pass filter that keeps a low-frequency beat frequency product of the mixer, wherein a temperature coefficient of frequency (TCF) of the beat frequency is higher than a TCF of each of the oscillation signals; forming a sensing circuit that creates a signal proportional to a temperature change of the beat frequency signal. Other aspects include forming a reference oscillator using a longitudinal mode of the dual mode resonator and a first of the two amplifiers; forming a temperature sensor oscillator using a shear mode of the resonator and a second of the two amplifiers; forming a programmable temperature compensation circuit that uses an oscillation signal of the temperature sensor oscillator; and forming a fractional N-frequency synthesize circuit, wherein an oscillation signal of the reference oscillator and the temperature compensation circuit control the fractional N-frequency synthesize circuit.

Another aspect of the present disclosure includes forming additional dual-mode resonators on the semiconductor substrate in a ladder or lattice configuration; electrically connecting the dual-mode resonator and the additional dual-mode resonators in series and connecting one or more shunt resonators having different frequencies from the resonators connected in series, forming a dual-band acoustic filter.

Other aspects include forming a low noise amplifier (LNA) on the semiconductor substrate; connecting the dual band acoustic filter and the LNA; forming a passive network on the substrate for separating the two bands of the dual-band acoustic filter; connecting the LNA and the passive network; forming a single-pole dual-throw (SPDT) switch on the substrate for alternately selecting one of the two bands; and connecting the passive network and the SPDT switch, forming an RF front-end module.

Another aspect of the present disclosure is a device including a dual-mode resonator including a semiconductor substrate, a material on the semiconductor substrate, having a cavity formed therein, a seed layer over the cavity in a V-shape, wherein sides of the V-shape form an angle of 15 to 25 degrees with a horizontal line, a bottom electrode on the seed layer, an acoustic layer on the bottom electrode; a top electrode on the acoustic layer, and a mass loading layer on the top electrode; and a cap over the dual-mode resonator. Another aspect includes two transconductance transistor amplifiers on the substrate and connected to the dual mode resonator, forming a monolithic dual MEMS oscillator. Other aspects include a first oscillator using a first mode of the dual mode resonator and a first of the two amplifiers; a second oscillator using a second mode of the resonator and a second of the two amplifiers; a frequency multiplier that up-converts an oscillation signal of the first or the second oscillator; a mixer that multiplies both oscillation signals; a low-pass filter that keeps a low-frequency beat frequency product of the mixer, wherein a temperature coefficient of frequency (TCF) of the beat frequency is higher than a TCF of each of the oscillation signals; and a sensing circuit that creates a signal proportional to a temperature change of the beat frequency signal. Further aspects include a reference oscillator using a longitudinal mode of the dual mode resonator and a first of the two amplifiers; a temperature sensor oscillator using a shear mode of the resonator and a second of the two amplifiers; a programmable temperature compensation circuit that uses an oscillation signal of the temperature sensor oscillator; and a fractional N-frequency synthesize circuit, wherein an oscillation signal of the reference oscillator and the temperature compensation circuit control the fractional N-frequency synthesize circuit.

A further aspect includes additional dual-mode resonators on the semiconductor substrate in a ladder or lattice configuration; the dual-mode resonator and the additional dual-mode resonators electrically connected in series and one or more shunt resonators having different frequencies from the resonators connected in series, forming a dual-band acoustic filter. Additional aspects include a LNA on the semiconductor substrate; the dual band acoustic filter and the LNA; a passive network on the substrate for separating the two bands of the dual-band acoustic filter; the LNA and the passive network; forming a SPDT switch on the substrate for alternately selecting one of the two bands; and connecting the passive network and the SPDT switch, forming an RF front-end module.

Another aspect of the present disclosure is a method including forming a material on a semiconductor substrate; forming a V-shaped groove in the material, forming a grooved area, sides of the V-shaped groove forming an angle of 15 to 25 degrees with a horizontal line; forming an acoustic mirror or Bragg reflector on the grooved area: forming a seed layer on the acoustic mirror or Bragg reflector; forming a bottom electrode on the seed layer; forming an acoustic layer on the bottom electrode; forming a top electrode on the acoustic layer; forming a mass loading layer on the top electrode, forming a dual-mode resonator; and forming a cap over the dual-mode resonator.

Another aspect of the present disclosure is a device including: a dual-mode resonator including: a semiconductor substrate; a material on the semiconductor substrate, the material having a V-shaped groove, forming a grooved area, with sides of the V-shaped groove forming an angle of 15 to 25 degrees with a horizontal line; an acoustic mirror or Bragg reflector on the grooved area; a seed layer over the acoustic mirror or Bragg reflector; a bottom electrode on the seed layer; an acoustic layer on the bottom electrode; a top electrode on the acoustic layer; and a mass loading layer on the top electrode; and a cap over the dual-mode resonator.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
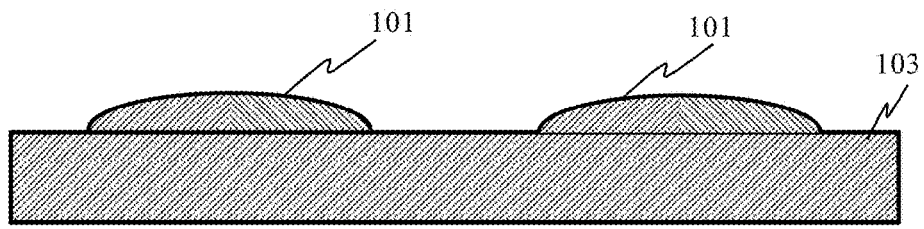
FIGS. 1A through 1I schematically illustrate a method of making a dual mode acoustic MEMS resonator having a V-shaped groove, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of increased module footprint attendant upon using conventional acoustic filters in an RF module due to the need for two resonators to be suitable for all LTE bands. In addition, the present disclosure addresses and solves the current problems of insufficient high frequency operation attendant upon Si-made MEMS oscillators, thermal drifting that is too large for timing applications and too small for thermal sensing applications attendant upon AlN resonator oscillators, and uncertain thermal gradient between resonators resulting in decreased sensitivity and accuracy, increased footprint, uneven energy and low electromechanical efficiency attendant upon using conventional MEMS sensors for thermometric beat frequency sensors. In accordance with embodiments of the present disclosure, a dual mode MEMS resonator in a single physical structure is formed and used in dual band acoustic filters, MEMS oscillators thermometric beat frequency sensors and timing devices.

Methodology in accordance with embodiments of the present disclosure includes forming a V-shaped groove in a material on a semiconductor substrate, forming a grooved area, with sides of the V-shaped groove forming an angle of 15 to 25 degrees with a horizontal line. A seed layer, a bottom electrode, an acoustic layer, and a top electrode are consecutively formed on the grooved area. A mass loading layer is then formed on the top electrode. Release vias are formed on opposite sides of the grooved area through the top electrode, the acoustic layer, the bottom electrode, and the seed layer, and at least a portion of the material is removed through the release vias, forming a dual-mode resonator. Last, a cap is formed over the dual-mode resonator. The resulting structure has a footprint which is 50% smaller than conventional resonators, is suitable for all LTE bands, and when used in an oscillator enables a highly sensitive thermal sensor and a highly stable timing source.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
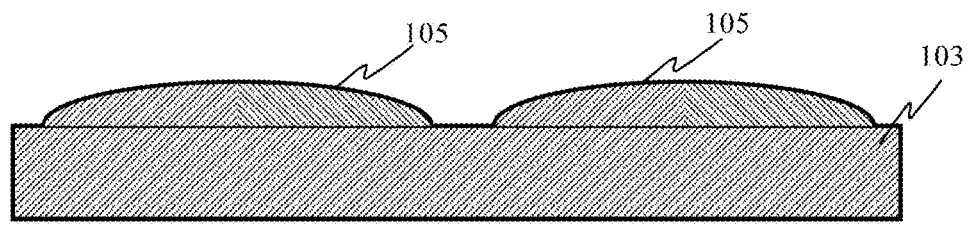
Figure 1C:
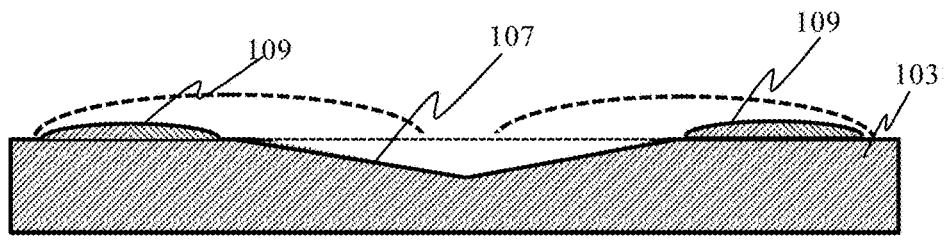
Figure 1D:
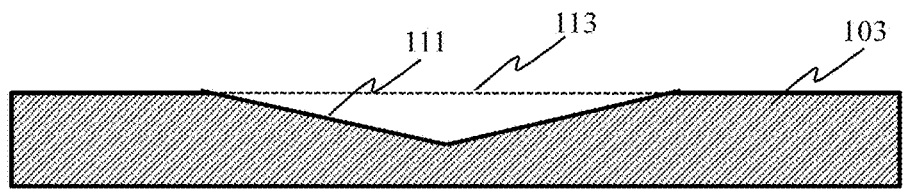

Referring to FIG. 1A, a photoresist 101 is formed on a material 103 such as a silicon (Si) wafer, e.g. Si (100). The material may alternatively be molybdenum (Mo), tungsten (W), or polysilicon. The photoresist 101 has two portions that are separated from each other. Photoresist reflowing and profiling is performed by baking at a temperature of 150° C. to 250° C., for example at 180° C. As a result, photoresist 101 expands, becoming photoresist 105, with the two portions separated by 7 μm to 25 μm, as illustrated in FIG. 1B. Next, the Si is dry etched, e.g. by reactive ion etching (RIE). The etching causes most of the photoresist to be consumed, and a V-shaped groove 107 to be formed in the material 103 between remaining portions 109 of the photoresist, as shown in FIG. 1C. Dry etching continues, as illustrated in FIG. 1D, until the photoresist 109 is removed and groove 107 is formed to an angle of 15° to 25° between each side 111 of the groove 107 and horizontal line 113.

Figure 1E:
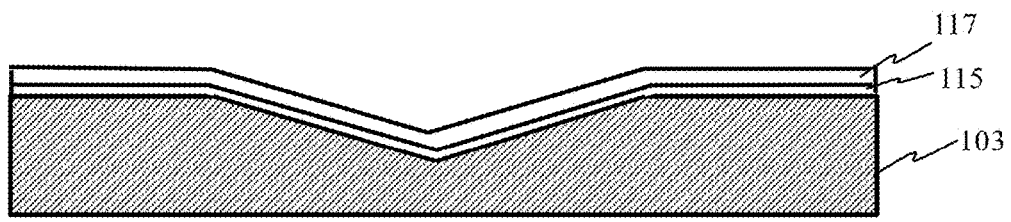

Adverting to FIG. 1E, a seed layer 115 of any suitable material for convenient crystal growth, for example AlN, scandium aluminum nitride (ScAlN), lead zirconate titanate (PZT), zinc oxide (ZnO), lithium tantalate (LiTaO$_3$), or lithium niobate (LiNbO$_3$), and a metal bottom electrode 117, for example of molybdenum (Mo), tungsten (W), aluminum (Al), platinum (Pt), chromium (Cr), or titanium (Ti), are deposited and patterned on the grooved area and anchored to the substrate outside the grooved area (not shown for illustrative convenience). The seed layer 115 is formed to a thickness of 5 nm to 50 nm, and the bottom electrode 117 is formed to a thickness to 150 nm to 400 nm.

Figure 1F:
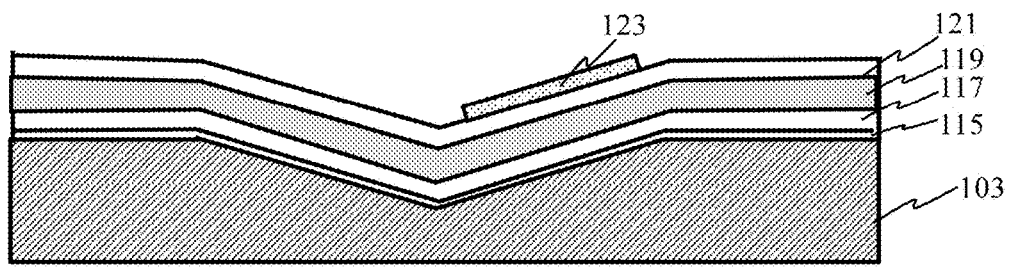
Figure 1G:
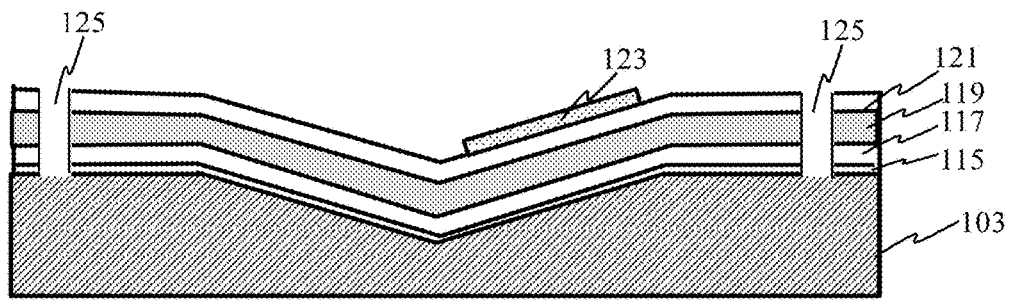
Figure 1H:
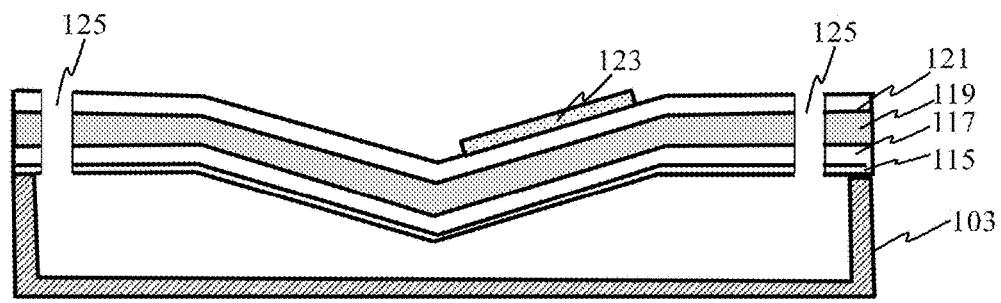

As shown in FIG. 1F, an acoustic material layer 119 followed by a metal top electrode 121 are then deposited and patterned over the bottom electrode in the grooved area. Acoustic material layer 119 may be formed of any thin-film piezoelectric material, for example, of AlN, ScAlN, PZT, zinc oxide ZnO, LiTaO$_3$, or LiNbO$_3$, to a thickness of 0.5 micrometers (μm) to 3.0 μm. The metal top electrode 121 may be formed similar to bottom electrode 117, for example of Mo or W, to a thickness of 150 nm to 500 nm. Further, metal top electrode 121 may be patterned, for example, by spray coating a photoresist, forming an antireflective photoresist to avoid unwanted photoresist patterning due to V-reflected waves, filling with oxide, and performing chemical mechanical polishing (CMP), to ensure electrode patterning in the grooved area (not shown for illustrative convenience). A mass loading layer 123 of any conductive or dielectric material, is then formed in the grooved area on one side of the top electrode 121, to a length of 2 μm to 40 μm and to a thickness of 5 nm to 100 nm. As illustrated in FIG. 1G, vias 125 are patterned and etched, e.g. by dry etching, through seed layer 115, bottom electrode 117, acoustic layer 119, and top electrode 121, down to material 103 at opposite sides of the grooved area. Then, the material 103 is released by etching through the vias 125, as illustrated in FIG. 1H. The etching may be controlled by surrounding the layer with an etch-stop material (further described with respect to FIGS. 2A and 2B) or by controlling the etching time. Last, a capping (bonded) wafer or thin-film encapsulation 127 is formed, as shown in FIG. 1I.

Figure 2A:
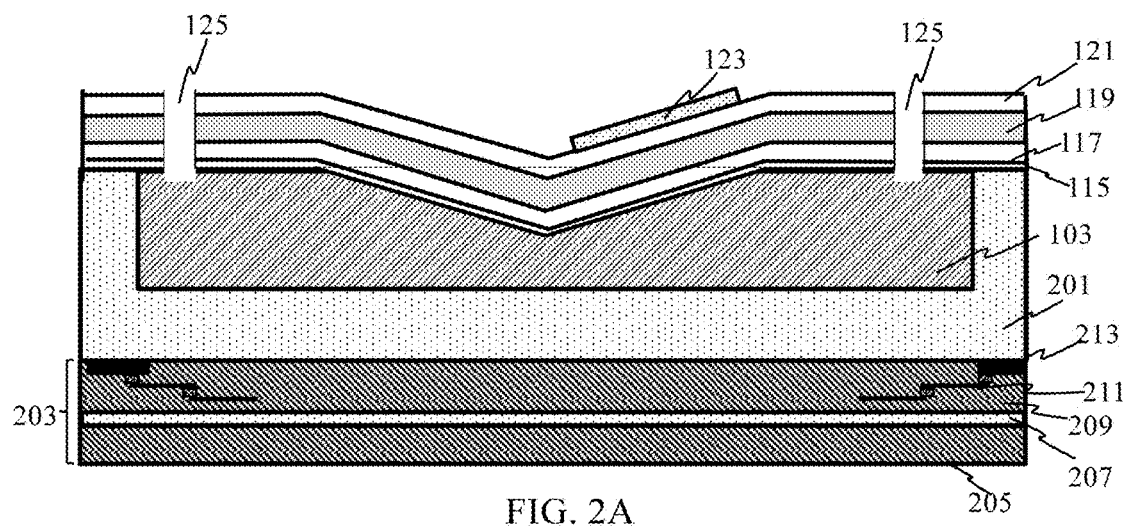
FIGS. 2A and 2B schematically illustrate the method steps shown in FIGS. 1 H and 1I with a dielectric interposer.
Figure 2B:
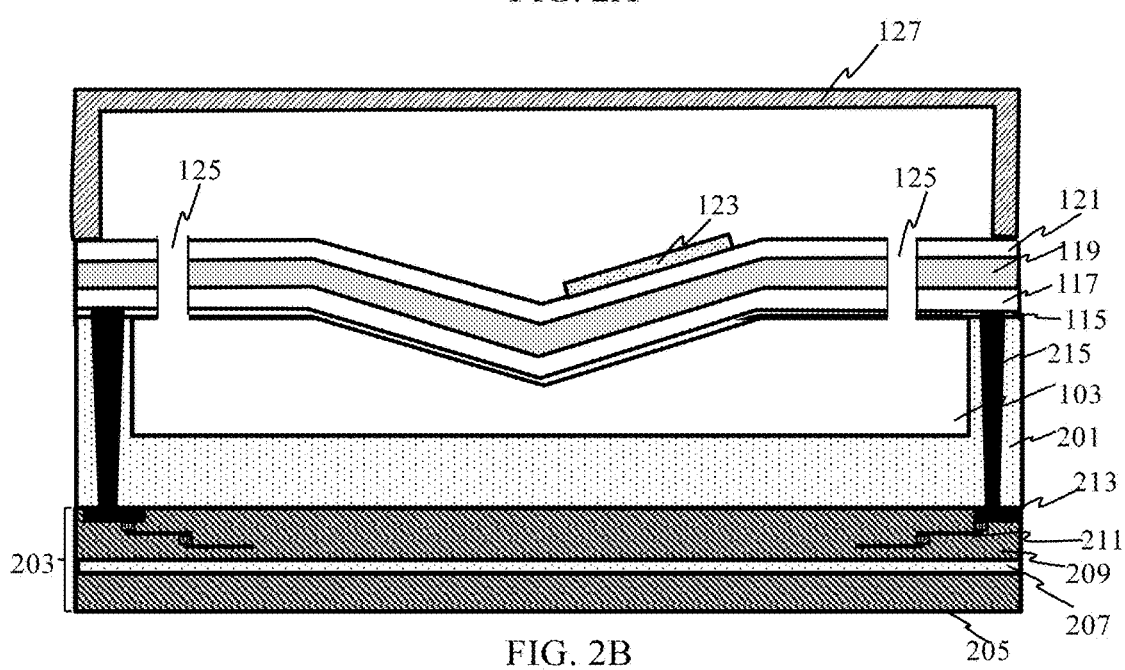

As shown in FIG. 2A (and referenced above), steps 1A through 1G may be performed with material 103 beginning on and surrounded by a dielectric insulating interposer 201, for example an oxide. Further, the insulating interposer 201 may be formed on an RF silicon-on-insulator (RFSOI) 203, e.g. an Si handle 205, a BOX layer 207, and an Si layer 209, with integrated circuits (ICs) 211 (such as oscillators or passive devices), and contacts 213. Then, as illustrated in FIG. 2B, when material 103 is released by etching through the vias 125, insulating interposer 201 acts as an etch stop. Subsequent to etching, application-specific integrated circuit (ASIC) interconnects 215 may be formed down to contacts 213, and capping (bonded) wafer or thin-film encapsulation 127 may be formed.

Figure 3:
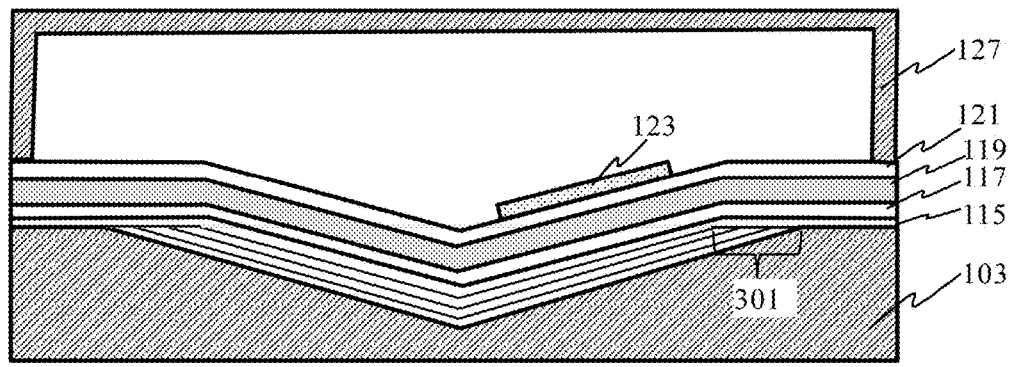
FIG. 3 schematically illustrates an alternative embodiment to the MEMS resonator of FIG. 1I in which an acoustic mirror or Bragg reflector formed on the grooved area.

Alternatively, prior to forming seed layer 115 on the grooved area, an acoustic mirror or Bragg reflector 301 may be formed on the grooved area, as illustrated in FIG. 3. Bragg reflector 301 is formed, e.g., by depositing layers of alternating high/low acoustic impedance values and with as close as possible to an approximate thickness of nλ/4, wherein n is a positive odd integer, over the V-shaped groove. The Bragg reflector 301 may be planarized, e.g., by chemical mechanical polishing (CMP), down to the material 103.

Figure 1I:
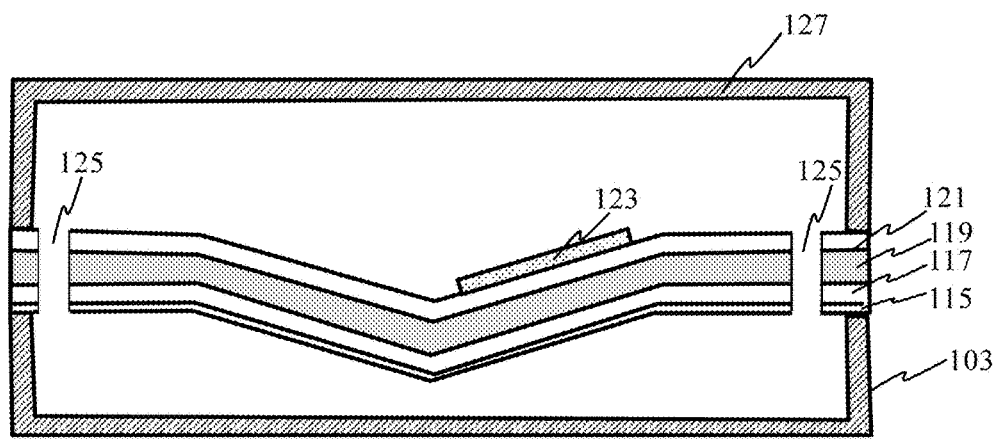
Figure 4:
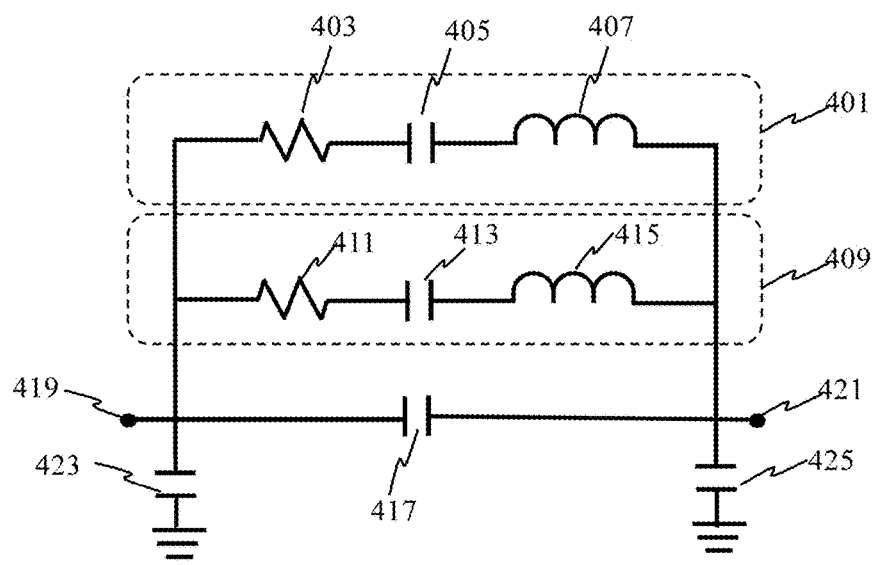
FIG. 4 illustrates a model circuit for the MEMS resonators of FIGS. 1I, 2B, and 3.

Each of the resulting structures of FIGS. 1I, 2B, and 3 forms a dual-mode acoustic MEMS resonator with a thickness shear mode (lower frequency) and a thickness extensional (longitudinal) mode (higher frequency) with coupling coefficients of $k^2_{33}$ and greater than 4 percent (%), respectively. Adverting to FIG. 4, the resonator can be modeled by two motional branches and a feedthrough parallel-plate capacitor. As illustrated, the longitudinal mode motional branch 401 includes a resistor 403, a capacitor 405, and an inductor 407, and the shear mode motional branch 409 includes a resistor 411, a capacitor 413, and an inductor 415 (different from resistor 403, a capacitor 405, and an inductor 407, respectively) connected in series. The feedthrough parallel-plate capacitor 417 is in parallel with the two motional branches, between ports 419 and 421, and capacitors 423 and 425 each have a capacitance equivalent to the sum of static capacitances, substrate capacitances and other capacitances associated to the ports, interconnection, etc. For example, for a device with a bottom electrode connected to ground and parallel-plate capacitance C0, each of capacitors 423 and 425 may have a capacitance of $C_0/2$.

Figure 5A:
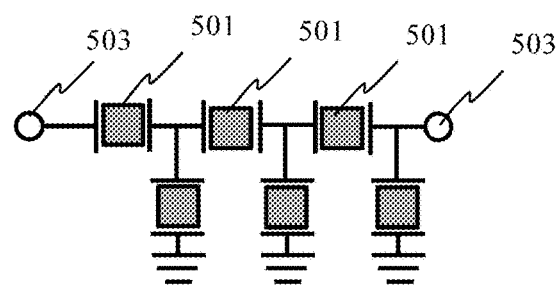
FIGS. 5A and 5B schematically illustrate a dual-band acoustic filter having plural dual-mode acoustic MEMS resonators of FIG. 1I, 2B, or 3 in a ladder or lattice configuration.
Figure 5B:
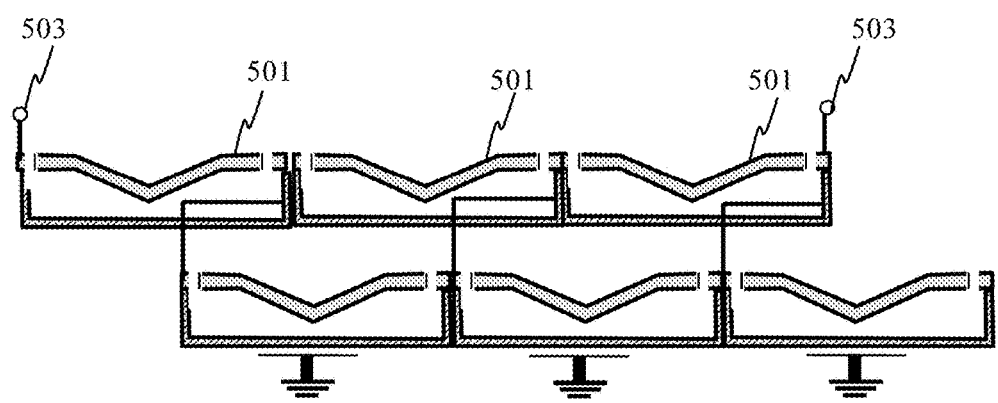

Adverting to FIGS. 5A and 5B, a dual-band acoustic filter may be formed by connecting plural dual-mode acoustic MEMS resonators 501 in series in a ladder or lattice configuration between two ports 503. The two frequencies of each resonator in the ladder or lattice are defined by the acoustic velocities of the shear and longitudinal modes. As a result, the filter spectrum has two passbands.

Figure 6:
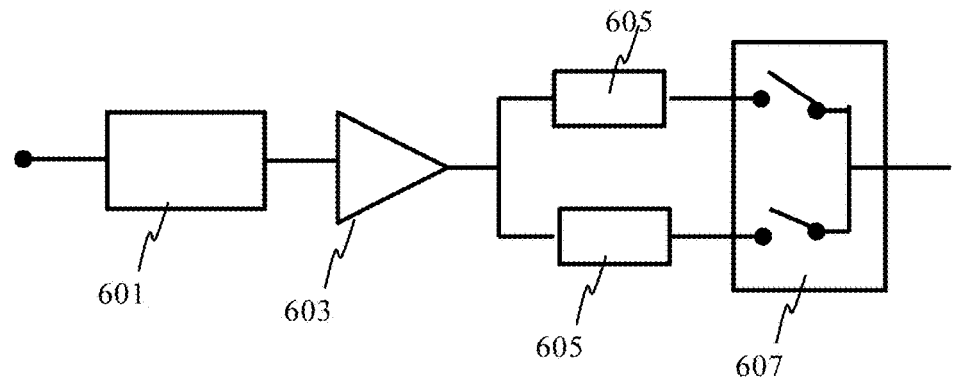
FIG. 6 schematically illustrates an RF front-end module (FEM) including a dual-band acoustic filter of FIGS. 5A and 5B.

FIG. 6 illustrates an RF front-end module (FEM) using a dual-band acoustic filter shown in FIGS. 5A and 5B. Conventional RF-FEMs require a single pole, multiple throw (SPnT) switch at the antenna port, followed by one filter per band, another SPnT switch at the low noise amplifier (LNA) port, and the LNA. As shown in FIG. 5, by using dual-band acoustic filters 601, the input SPnT (the largest element in the module) and half of the filters may be eliminated. As such, for every two bands, there is one dual-band acoustic filter 601, followed by LNA 603, two low-complexity matching networks 605, for example inductor-capacitor (LC) networks, and one SPnT switch 607. Further, since the bands are far apart, simple, small LC networks can be used to separate the two bands.

Figure 7:
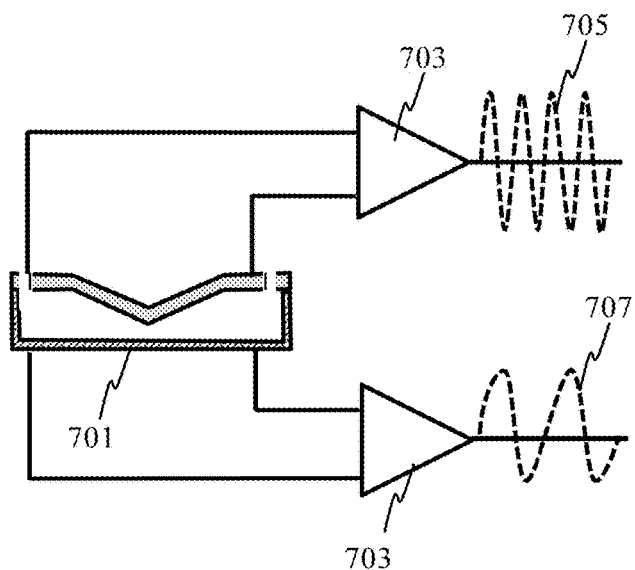
FIG. 7 schematically illustrates a dual-mode MEMS oscillator including a dual-mode acoustic MEMS resonator of FIG. 1I, 2B, or 3.

In addition to being used for dual-band acoustic filters, the dual-mode acoustic MEMS resonator of FIGS. 1I, 2B, and 3 may be connected to two transconductance transistor amplifiers, capacitors and inductors all fabricated on the same integrated circuit (IC) semiconductor wafer substrate, as illustrated in FIG. 7, to form a monolithic dual MEMS oscillator. As shown in FIG. 7, dual-mode resonator 701 connects to two amplifying circuits 703 configured to promote oscillation, for example, Pierce oscillators or Colpitts oscillators. Though not shown for illustrative convenience, passive components may also be included to promote oscillation. Each circuit 703 is designed to lock at a different frequency. The resulting oscillator has two output signals, the longitudinal mode higher frequency signal 705 and the shear mode lower frequency signal 707, which lock to the frequencies of the two resonant modes of the V-groove resonator 701.

Figure 8:
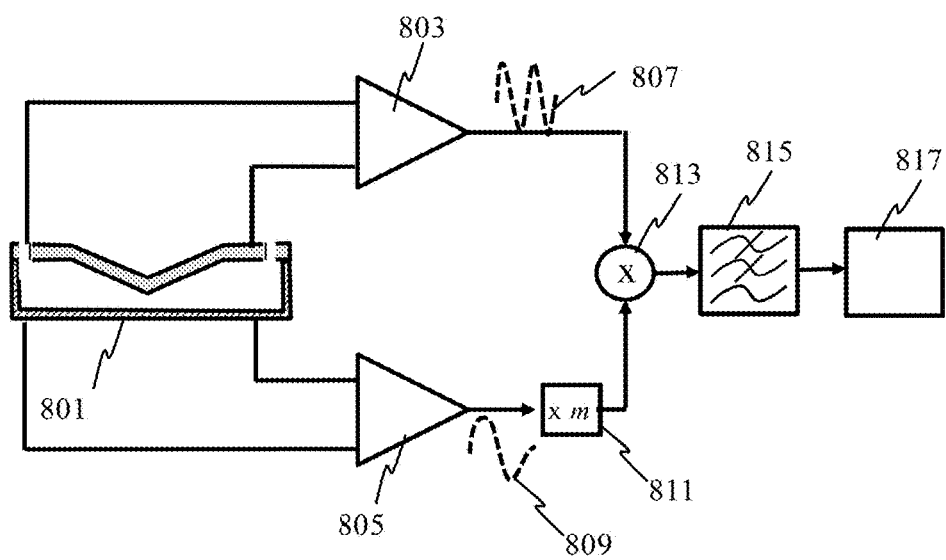
FIG. 8 schematically illustrates a thermometric beat frequency thermal sensor circuit including the dual-mode MEMS oscillator of FIG. 7.

Adverting to FIG. 8, the dual-mode MEMS oscillator of FIG. 7 is combined with a low pass filter and sensing circuit to form a thermometric beat frequency thermal sensor circuit. As illustrated, a MEMs dual mode resonator 801 is connected to two amplifying circuits 803 and 805 configured to promote oscillation. Amplifying circuit 803 uses the longitudinal mode of the resonator to produce a signal 807 with a high frequency $f_1$, and amplifying circuit 805 uses the shear mode of the resonator to produce a signal 809 with a lower frequency $f_2$. At multiplier 811, frequency $f_2$ is multiplied by m, chosen by design to be as close as possible to the frequency ratio $r=f_2/f_1>1$. Multiplied signal 809 and signal 807 are then multiplied at ideal mixer 813, and the resulting product is passed through low pass filter 815 to produce a signal with a beat frequency $f_B=m\times f_1-f_2$, where $f_B\ll f_1,f_2$, a temperature coefficient of frequency (TCF) of $f_B$ is much higher than the TCF of the individual oscillation signals and is defined as:

$$TCF_{fB} \text{ to the first order} = \frac{1}{(m-r)} - (m \times TCF_{f1} - r \times TCF_{f2}).$$

a temperature sensing circuit 817 that creates a signal proportional to the temperature change of the beat frequency signal.

Figure 9:
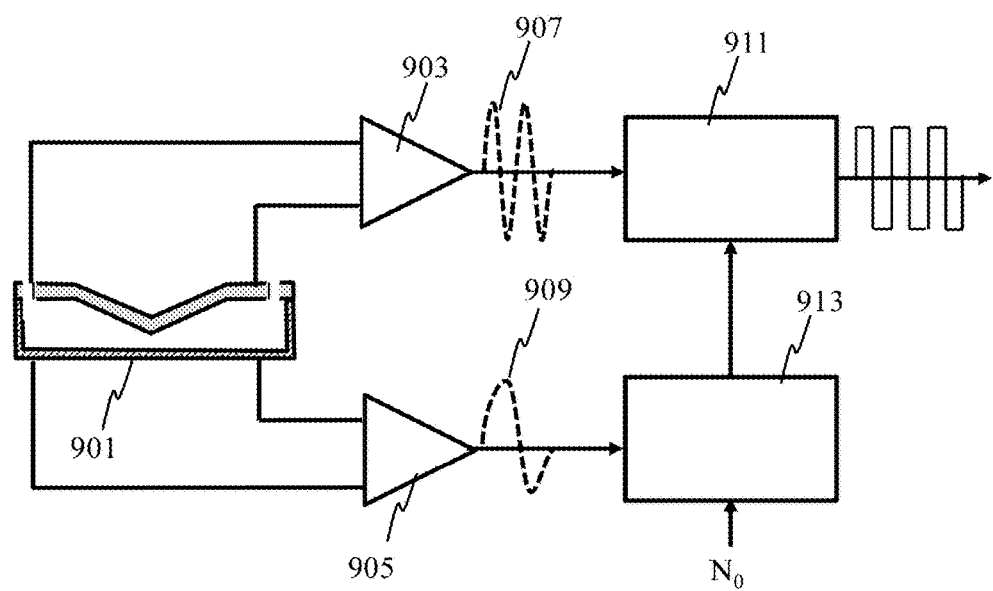
FIG. 9 schematically illustrates a timing source including the dual-mode MEMS oscillator of FIG. 7.

The dual MEMS oscillator of FIG. 7 may also be combined with a fractional-N frequency synthesizer and temperature compensation logic, as illustrated in FIG. 9, to form a timing source. More specifically, dual mode MEMS is connected to oscillator circuit 903 to create a reference oscillator and to oscillator circuit 905 to create a thermal sensor. Reference oscillator circuit 903 outputs a signal with $f_2$, the longitudinal mode higher frequency 907, and the first order TCF (f(T)) $N_{LM}$ (which is negative for AlN), and sensor oscillator circuit 905 outputs a signal with $f_1$, the shear mode lower frequency 909, and controls the compensation circuit. The fractional-N frequency synthesizer 911 up-converts frequency with the TCF of $f_{clock}\ll TCFs$ of $f_2$. $N_0$ is a programmable parameter of the compensation circuit 913 which is chosen to be about $-1/N_{LM}$.

The embodiments of the present disclosure can achieve several technical effects, such as a reduced footprint for a MEMS resonator, a dual band filter, and a thermometric beat sensor, scalability and suitability of the dual band filter for most LTE bands, improved electromechanical and electrical performance for the dual band filter, large frequency separation yielding improved sensitivity for the thermometric beat sensor, and zero thermal gradient which in turn yields higher stability for a timing source. The present disclosure enjoys industrial applicability in any of various types of highly integrated semiconductor devices, such as high-end phones, dual band acoustic filters, monolithic RF front-end modules, oscillators, thermometric beat frequency sensors, and timing sources.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A device comprising:
a dual-mode resonator comprising:
a semiconductor substrate;
a material on the semiconductor substrate, having a cavity formed therein;

a seed layer over the cavity in a V-shape, wherein sides of the V-shape form an angle of 15 to 25 degrees with a horizontal line;
a bottom electrode on the seed layer;
an acoustic layer on the bottom electrode;
a top electrode on the acoustic layer; and
a mass loading layer on the top electrode; and
a cap over the dual-mode resonator.

2. The device according to claim 1, further comprising the top and bottom electrodes and the mass loading layer being formed of metal and the acoustic layer being formed of a piezoelectric material.

3. The device according to claim 1, further comprising contact vias between the top and bottom electrodes.

4. The device according to claim 1, wherein the substrate comprises an RF semiconductor-on-insulator wafer with integrated circuits (ICs).

5. The device according to claim 4, further comprising two transconductance transistor amplifiers on the substrate and connected to the dual mode resonator, forming a monolithic dual MEMS oscillator.

6. The device according to claim 5, comprising:
a first oscillator using a first mode of the dual mode resonator and a first of the two amplifiers;
a second oscillator using a second mode of the resonator and a second of the two amplifiers;
a frequency multiplier that up-converts an oscillation signal of the first or the second oscillator;
a mixer that multiplies both oscillation signals;
a low-pass filter that keeps a low-frequency beat frequency product of the mixer, wherein a temperature coefficient of frequency (TCF) of the beat frequency is higher than a TCF of each of the oscillation signals; and
a sensing circuit that creates a signal proportional to a temperature change of the beat frequency signal.

7. The device according to claim 5, further comprising:
a reference oscillator using a longitudinal mode of the dual mode resonator and a first of the two amplifiers;
a temperature sensor oscillator using a shear mode of the resonator and a second of the two amplifiers;
a programmable temperature compensation circuit that uses an oscillation signal of the temperature sensor oscillator; and
a fractional N-frequency synthesize circuit, wherein an oscillation signal of the reference oscillator and the temperature compensation circuit control the fractional N-frequency synthesize circuit.

8. The device according to claim 1, further comprising an acoustic mirror or Bragg reflector on the grooved area under the seed layer.

9. The device according to claim 1, further comprising:
additional dual-mode resonators on the semiconductor substrate in a ladder or lattice configuration; and
the dual-mode resonator and the additional dual-mode resonators electrically connected in series and one or more shunt resonators having different frequencies from the resonators connected in series, forming a dual-band acoustic filter.

10. The device according to claim 9, further comprising:
a low noise amplifier (LNA) on the semiconductor substrate;
the dual band acoustic filter and the LNA;
a passive network on the substrate for separating the two bands of the dual-band acoustic filter;
the LNA and the passive network;
forming a single-pole dual-throw (SPDT) switch on the substrate for alternately selecting one of the two bands; and
connecting the passive network and the SPDT switch, forming an RF front-end module.

11. A device comprising:
a dual-mode resonator comprising:
a semiconductor substrate;
a material on the semiconductor substrate, the material having a V-shaped groove, forming a grooved area, with sides of the V-shaped groove forming an angle of 15 to 25 degrees with a horizontal line;
an acoustic mirror or Bragg reflector on the grooved area;
a seed layer over the acoustic mirror or Bragg reflector;
a bottom electrode on the seed layer;
an acoustic layer on the bottom electrode;
a top electrode on the acoustic layer; and
a mass loading layer on the top electrode; and
a cap over the dual-mode resonator.

12. A method comprising:
forming a material on a semiconductor substrate;
forming a V-shaped groove in the material, forming a grooved area, sides of the V-shaped groove forming an angle of 15 to 25 degrees with a horizontal line;
forming a seed layer on the grooved area;
forming a bottom electrode on the seed layer on at least the grooved area;
forming an acoustic layer on the bottom electrode on at least the grooved area;
forming a top electrode on the acoustic layer on at least the grooved area;
forming a mass loading layer on the top electrode on at least the grooved area;
forming release vias through the top electrode, the acoustic layer, the bottom electrode, and the seed layer;
removing at least a portion of the material through the release vias, forming a dual-mode resonator; and
forming a cap over the dual-mode resonator.

13. The method according to claim 12, further comprising forming the groove by:
forming photoresist portions on the material;
baking the photoresist portions, forming a separation between the photoresist portions;
dry etching the material through the photoresist portions until the photoresist is removed and the angle of 15 to 25 degrees is reached.

14. The method according to claim 12, comprising forming the top and bottom electrodes and the mass loading layer of metal and the acoustic layer of a piezoelectric material.

15. The method according to claim 12, comprising forming contact vias between the top and bottom electrodes prior to forming the release vias.

16. The method according to claim 15, comprising removing the material by dry etching.

17. The method according to claim 12, further comprising forming a dielectric interposer layer on the semiconductor substrate prior to forming the material, wherein the substrate comprises an RF semiconductor-on-insulator wafer with integrated circuits (ICs).

18. The method according to claim 17, further comprising:
forming two transconductance transistor amplifiers on the substrate; and
connecting the two amplifiers to the dual mode resonator, forming a monolithic dual MEMS oscillator.

19. The method according to claim 18, comprising:
forming a first oscillator using a first mode of the dual mode resonator and a first of the two amplifiers;
forming a second oscillator using a second mode of the resonator and a second of the two amplifiers;
forming a frequency multiplier that up-converts an oscillation signal of the first or the second oscillator;
forming a mixer that multiplies both oscillation signals;
forming a low-pass filter that keeps a low-frequency beat frequency product of the mixer, wherein a temperature coefficient of frequency (TCF) of the beat frequency is higher than a TCF of each of the oscillation signals;
forming a sensing circuit that creates a signal proportional to a temperature change of the beat frequency signal.

20. The method according to claim 18, further comprising:
forming a reference oscillator using a longitudinal mode of the dual mode resonator and a first of the two amplifiers;
forming a temperature sensor oscillator using a shear mode of the resonator and a second of the two amplifiers;
forming a programmable temperature compensation circuit that uses an oscillation signal of the temperature sensor oscillator; and
forming a fractional N-frequency synthesize circuit, wherein an oscillation signal of the reference oscillator and the temperature compensation circuit control the fractional N-frequency synthesize circuit.

21. The method according to claim 12, further comprising forming an acoustic mirror or Bragg reflector on the grooved area prior to forming the seed layer.

22. The method according to claim 12, further comprising:
forming additional dual-mode resonators on the semiconductor substrate in a ladder or lattice configuration;
electrically connecting the dual-mode resonator and the additional dual-mode resonators in series and connecting one or more shunt resonators having different frequencies from the resonators connected in series, forming a dual-band acoustic filter.

23. The method according to claim 22, further comprising:
forming a low noise amplifier (LNA) on the semiconductor substrate;
connecting the dual band acoustic filter and the LNA
forming a passive network on the substrate for separating the two bands of the dual-band acoustic filter;
connecting the LNA and the passive network;
forming a single-pole dual-throw (SPDT) switch on the substrate for alternately selecting one of the two bands; and
connecting the passive network and the SPDT switch, forming an RF front-end module.

24. A method comprising:
forming a material on a semiconductor substrate;
forming a V-shaped groove in the material, forming a grooved area, sides of the V-shaped groove forming an angle of 15 to 25 degrees with a horizontal line;
forming an acoustic mirror or Bragg reflector on the grooved area:
forming a seed layer on the acoustic mirror or Bragg reflector;
forming a bottom electrode on the seed layer;
forming an acoustic layer on the bottom electrode;
forming a top electrode on the acoustic layer;
forming a mass loading layer on the top electrode, forming a dual-mode resonator; and
forming a cap over the dual-mode resonator.

* * * * *